United States Patent
Moon et al.

(10) Patent No.: US 8,584,743 B2
(45) Date of Patent: Nov. 19, 2013

(54) SOLID TYPE HEAT DISSIPATION DEVICE

(75) Inventors: Seok-Hwan Moon, Daejeon (KR);
Seung Youl Kang, Daejeon (KR);
Kyoung Ik Cho, Daejeon (KR); Moo Jung Chu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 778 days.

(21) Appl. No.: 12/765,120

(22) Filed: Apr. 22, 2010

(65) Prior Publication Data
US 2011/0056671 A1    Mar. 10, 2011

(30) Foreign Application Priority Data
Sep. 7, 2009   (KR) .................. 10-2009-0084037

(51) Int. Cl.
*F28F 7/00*   (2006.01)

(52) U.S. Cl.
USPC ........................... 165/185; 165/905; 361/711

(58) Field of Classification Search
USPC ................ 165/185, 905; 361/711; 257/720
See application file for complete search history.

(56) References Cited

U.S. PATENT DOCUMENTS

| | | | | |
|---|---|---|---|---|
| 5,224,030 | A * | 6/1993 | Banks et al. | ........... 165/185 |
| 6,404,070 | B1 | 6/2002 | Higashi et al. | |
| 7,298,028 | B2 * | 11/2007 | Lin et al. | ........... 257/675 |
| 2003/0111213 | A1 | 6/2003 | Chang et al. | |
| 2003/0116312 | A1 * | 6/2003 | Krassowski et al. | ........... 165/185 |
| 2004/0150951 | A1 | 8/2004 | Yatougo et al. | |
| 2007/0000642 | A1 | 1/2007 | Yamazaki et al. | |
| 2007/0102142 | A1 * | 5/2007 | Reis et al. | ........... 165/80.3 |
| 2007/0159799 | A1 * | 7/2007 | Dando et al. | ........... 361/709 |
| 2008/0171194 | A1 | 7/2008 | Ko et al. | |

FOREIGN PATENT DOCUMENTS

| | | |
|---|---|---|
| JP | 2005-303114 A | 10/2005 |
| KR | 10-2007-0003627 A | 1/2007 |
| KR | 10-0787278 B1 | 12/2007 |

OTHER PUBLICATIONS

Shung-Wen Kang et al, "Metallic Micro Heat Pipe Heat Spreader Fabrication", Applied Thermal Engineering, vol. 24, 2004, p. 299-309.
Gary Shives et al, "Comparative thermal performance evaluation of graphite/epoxy fin heat sinks", 2004 Inter Society Conference on Thermal Phenomena, p. 410-417.
S. Tzanova et al, "Analytical Investigation of Flat Silicon Micro Heat Spreader", IAS 2004, p. 2296-2302.

* cited by examiner

*Primary Examiner* — Teresa Walberg
(74) *Attorney, Agent, or Firm* — Rabin & Berdo, P.C.

(57) ABSTRACT

Provided is a solid type heat dissipation device for electronic communication appliances. The solid type heat dissipation device includes a graphite thin plate horizontally transferring heat, a plurality of metal fillers passing through the graphite thin plate to vertically transfer heat, and a plurality of metal thin plates attached to upper and lower surfaces of the graphite thin plate and connected to the metal fillers.

12 Claims, 9 Drawing Sheets

SOLID TYPE HEAT DISSIPATION DEVICE

CROSS-REFERENCE TO RELATED APPLICATIONS

This U.S. non-provisional patent application claims priority under 35 U.S.C. §119 of Korean Patent Application No. 10-2009-0084037, filed on Sep. 7, 2009, the entire contents of which are hereby incorporated by reference.

BACKGROUND OF THE INVENTION

The present invention disclosed herein relates to a solid type heat dissipation device, and more particularly, to a lightweight and thin solid type heat dissipation device that improves thermal conductivity.

Recently, semiconductor devices are required to have high efficiency and high reliability. However, heat generated from semiconductor devices degrades their efficiency and reliability.

Small portable electronic communication devices including sub-notebooks, cellular phones, portable multimedia players (PMPs), and game consoles are gradually becoming lighter and slimmer, and their heating value have reached about 100 $W/cm^2$. However, there is still a need for much slimmer small portable electronic communication devices. As electronic communication devices become slimmer, miniaturization, integration and heat control become more difficult to incorporate in their design.

Heat control technology of small electronic devices may be classified into control methods using passive cooling devices and control methods using active cooling devices, which are determined according to the required heat dissipation amount and the environment. A cooling device including a fan and a heat sink is used for an electronic appliance having a low heating value, and a cooling device including a heat pipe is used for an electronic appliance having a high heating value. As high performance electronic appliances are being developed in recent years, cooling devices including heat pipes are widely used.

However, as the size and thickness of electronic appliances decrease, the thickness of heat pipes should also be decreased. In this case, since heat pipes require wicks for generating capillary force therein, when the thickness of heat pipes are decreased, wicks may be damaged or their performance may be degraded. To address these limitations, research and development on plate type heat pipes has been actively carried out.

Although plate type heat pipes, having a thickness of about 1 mm, are adapted for portable electronic appliances, much slimmer cooling devices having a thickness less than 1 mm will be required. However, it is difficult to decrease the thickness of a heat pipe because of the limitation in securing space for gas flow that significantly affects the performance of the heat pipe.

SUMMARY OF THE INVENTION

The present invention provides a lightweight and thin solid type heat dissipation device that improves thermal conductivity.

Embodiments of the present invention provide solid type heat dissipation devices including: a graphite thin plate formed of graphite and including a plurality of through regions; a plurality of metal fillers respectively disposed in the through regions and contacting the graphite thin plate; and a plurality of metal thin plates attached to upper and lower surfaces of the graphite thin plate and connected to the metal fillers.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Figure 1A:
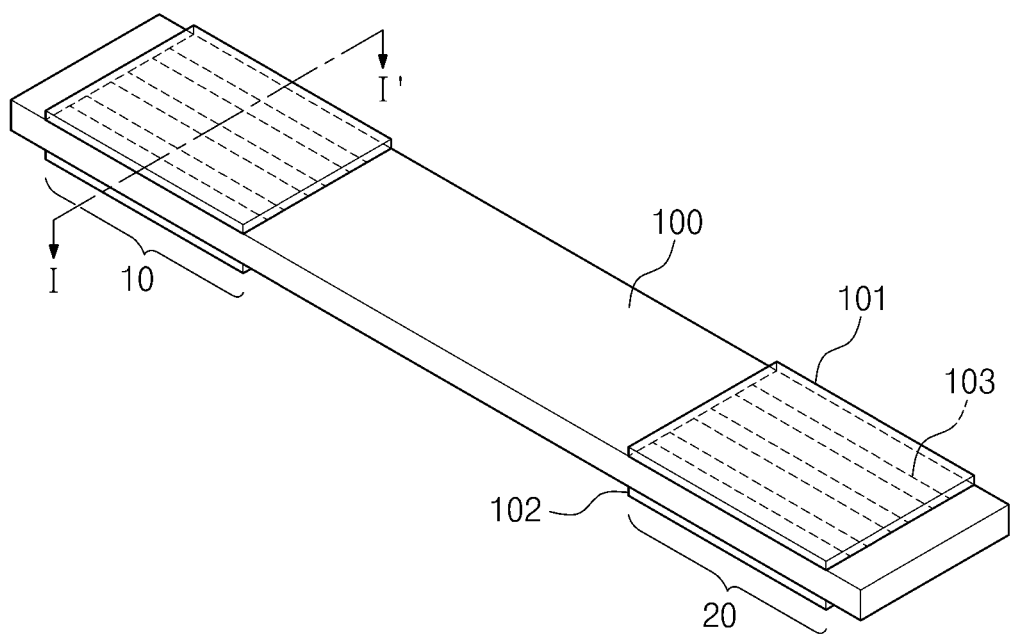
FIG. 1A is a perspective view illustrating a heat dissipation device according to an embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout.

In the following description, the technical terms are used only for explain a specific exemplary embodiment while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Additionally, the embodiment in the detailed description will be described with sectional views and/or plan views as ideal exemplary views of the present invention. In the figures, the dimensions of layers and regions are exaggerated for clarity of illustration. Areas exemplified in the drawings have general properties, and are used to illustrate a specific shape of a device. Thus, this should not be construed as limited to the scope of the present invention.

Hereinafter, a solid type heat dissipation device according to the embodiments of the present invention will now be described in detail with reference to the accompanying drawings.

Figure 1B:
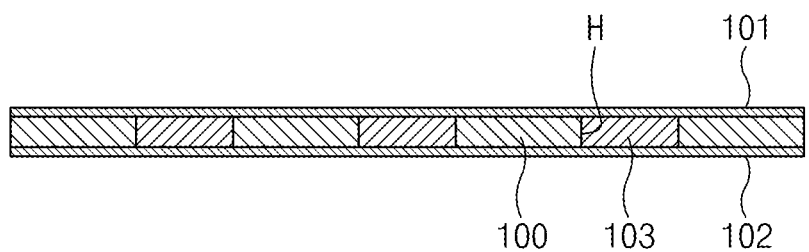
FIG. 1B is a cross-sectional view taken along line I-I' of FIG. 1A.
Figure 1C:
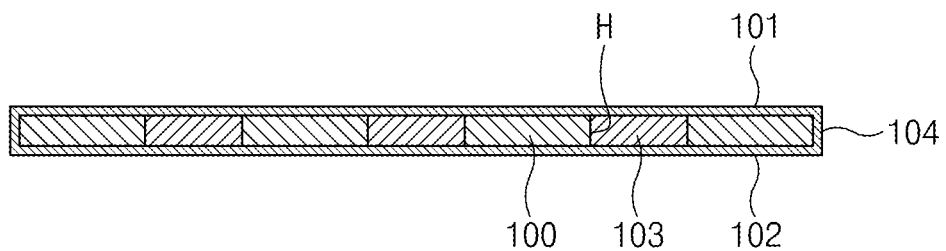
FIG. 1C is a cross-sectional view taken along line I-I' of FIG. 1A according to another embodiment of the present invention.

FIG. 1A is a perspective view illustrating a heat dissipation device according to an embodiment of the present invention. FIG. 1B is a cross-sectional view taken along line I-I' of FIG. 1A. FIG. 1C is a cross-sectional view taken along line I-I' of FIG. 1A, according to a modification of the current embodiment.

Referring to FIGS. 1A through 1C, the heat dissipation device includes a graphite thin plate 100, metal thin plates 101 and 102 on the upper and lower sides of the graphite thin plate 100, and metal fillers 103 passing through the graphite thin plate 100.

The graphite thin plate 100 is formed of graphite having a high thermal conductivity. Graphite has a hexagonal reticulate plane through covalent bond between carbon atoms. Horizontal thermal conductivity of graphite is greater than vertical thermal conductivity in fine structure. The graphite thin plate 100 is light, and may have a small thickness of about 1 mm or less. The graphite thin plate 100 may be a rectangle or a regular square, and the size and shape thereof may be varied according to the size of an electronic apparatus including the heat dissipation device. As such, the graphite thin plate 100 is applied to the heat dissipation device to improve horizontal heat transfer. The graphite thin plate 100 is applied to the heat dissipation device to obtain an ultra lightweight and ultra thin plate heat dissipation device.

The graphite thin plate 100 may include a heat absorption region 10 configured to absorb heat, and a heat dissipation region 20 configured to dissipate heat. The heat absorption region 10 may be spaced apart form the heat dissipation region 20. Heat absorbed through the heat absorption region 10 may be horizontally transferred in the graphite thin plate 100 and dissipated through the heat dissipation region 20. The heat absorption region 10 may be provided in plurality, and the heat dissipation region 20 may be provided in plurality. Heat may be dissipated and absorbed through at least one portion of the graphite thin plate 100 without separating the heat absorption region 10 from the heat dissipation region 20.

Rectangular through regions (or hollow regions H) may be disposed in the heat absorption region 10 and the heat dissipation region 20. The through regions H expose the inner walls of the graphite thin plate 100 and are spaced apart from each other. Particularly, the through regions H may have rectangles that are elongated in the longitudinal direction (or long-axis direction) of the graphite thin plate 100. The rectangular through regions H may be parallel to each other in the heat absorption region 10 and the heat dissipation region 20. The shapes of the through regions H are not limited to rectangles, and thus the shapes and sizes thereof may be varied.

The metal thin plates 101 and 102 are disposed on the upper and lower surfaces of the heat absorption region 10. The metal thin plates 101 and 102 are also disposed in the heat dissipation region 20. That is, the metal thin plates 101 and 102 partially cover the upper and lower surfaces of the graphite thin plate 100 to expose the surfaces of the graphite thin plate 100 between the heat absorption region 10 and the heat dissipation region 20. The metal thin plates 101 and 102 are formed of metal such as copper (Cu) and aluminum (Al). Vertical and horizontal heat transfer may be performed through the metal thin plates 101 and 102. The metal thin plates 101 may be coupled to the metal thin plates 102 through the metal fillers 103 passing through the graphite thin plate 100.

Referring to FIG. 1C, the metal thin plates 101 and 102 may be coupled to each other on side surfaces 104 at the edges of the graphite thin plate 100. That is, portions (the heat absorption region 10 and the heat dissipation region 20) of the rectangular graphite thin plate 100 may be surrounded by the metal thin plates 101 and 102.

The metal fillers 103 pass through the graphite thin plate 100 in the heat absorption region 10 and the heat dissipation region 20. In other words, the metal fillers 103 fill the through regions H in the heat absorption region 10 and the heat dissipation region 20. The metal fillers 103 may be formed of metal that is the same as that of the metal thin plates 101 and 102. The metal fillers 103 connect the metal thin plates 101 to the metal thin plates 102. The metal fillers 103 may have the same size as those of the through regions H disposed in the graphite thin plate 100. That is, according to the current embodiment, the metal fillers 103 may be rectangular metal patterns. The metal fillers 103 may be formed by previously fabricating patterns corresponding to the sizes of the through regions H, and then, by inserting the fabricated patterns into the through regions H, respectively. Since the metal fillers 103 are respectively inserted into the through regions H, the metal fillers 103 are spaced apart from each other.

Since the vertical thermal conductivity of the graphite thin plate 100 is less than the horizontal thermal conductivity, the metal fillers 103 passing through the graphite thin plate 100 are provided to improve the vertical thermal conductivity of the heat dissipation device including the graphite thin plate 100. In other words, the metal fillers 103 improve the vertical heat transfer through the heat absorption region 10 and the heat dissipation region 20.

Heat of the metal fillers 103 in the heat absorption region 10 and the heat dissipation region 20 may be transferred to the graphite thin plate 100 through the contact of the metal fillers 103 with the graphite thin plate 100. Thus, as the number of the metal fillers 103 disposed in the graphite thin plate 100 is increased, the contact area between the graphite thin plate 100 and the metal fillers 103 is increased, thereby improving the vertical thermal conductivity of the heat dissipation device.

Heat flow in the heat dissipation device according to the current embodiment is as follows. Heat, absorbed through the heat absorption region 10, is transferred through the metal thin plates 101 and 102 to the metal fillers 103 passing through the graphite thin plate 100. The heat transferred to the metal fillers 103 is transferred to the graphite thin plate 100. Heat of the heat absorption region 10 may be horizontally transferred to the heat dissipation region 20 through the graphite thin plate 100, and heat of the heat dissipation region 20 may be dissipated to the outside through the metal fillers 103 and the metal thin plates 101 and 102.

That is, the heat dissipation device according to the current embodiment includes the metal fillers 103 that pass through the graphite thin plate 100 having the higher horizontal thermal conductivity than the vertical thermal conductivity, thus improving the vertical thermal conductivity of the heat dissipation device and providing a lightweight, thin, and highly thermal conductive solid type heat dissipation device.

Figure 2A:
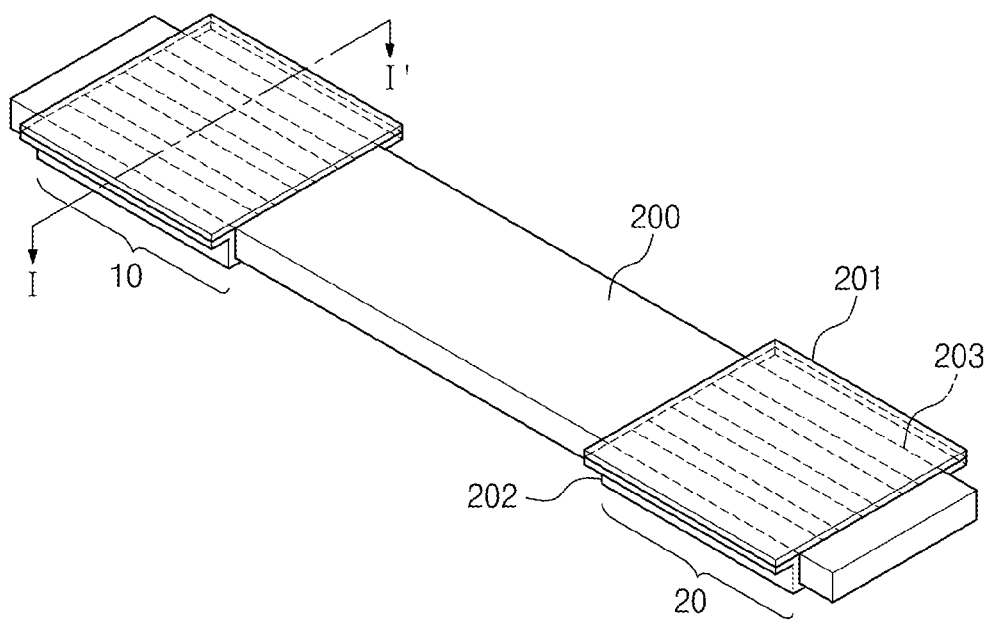
FIG. 2A is a perspective view illustrating a heat dissipation device according to another embodiment of the present invention.
Figure 2B:
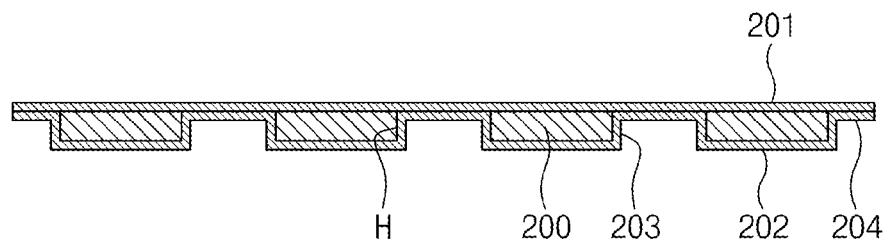
FIG. 2B is a cross-sectional view taken along line I-I' of FIG. 2A.

FIG. 2A is a perspective view illustrating a heat dissipation device according to another embodiment of the present invention. FIG. 2B is a cross-sectional view taken along line I-I' of FIG. 2A. The configuration and function of the heat dissipation device according to the current embodiment are substantially the same as the heat dissipation device according to the previous embodiment. Thus, the differences between the current embodiment and the previous embodiment will now be described in detail.

Referring to FIGS. 2A and 2B, according to the current embodiment, at least one of metal thin plates 201 and 202 on the upper and lower sides of the heat dissipation device may be formed through a coining process, and the metal thin plates 201 and 202 may be attached to each other through a welding process. That is, one of the metal thin plates 201 and 202 on one side may extend through the coining process to the inner walls of a graphite thin plate 200 exposed through the through regions H.

Since the metal thin plates 201 and 202 are formed through a coining process, metal fillers 203 covering the side walls of the graphite thin plate 200 may be formed from portions of the metal thin plates 201 and 202. That is, the metal fillers 203 are in close contact with the side walls of the graphite thin plate 200, and may not completely fill the through regions H of the graphite thin plate 200. The metal thin plates 201 and 202 may be in contact with each other in the through regions H of the graphite thin plate 200. Attachment portions 204 of the metal thin plates 201 and 202 may be disposed at the edges of the graphite thin plate 200. Thus, the metal thin plates 201 and 202 may seal the graphite thin plate 200.

Figure 3A:
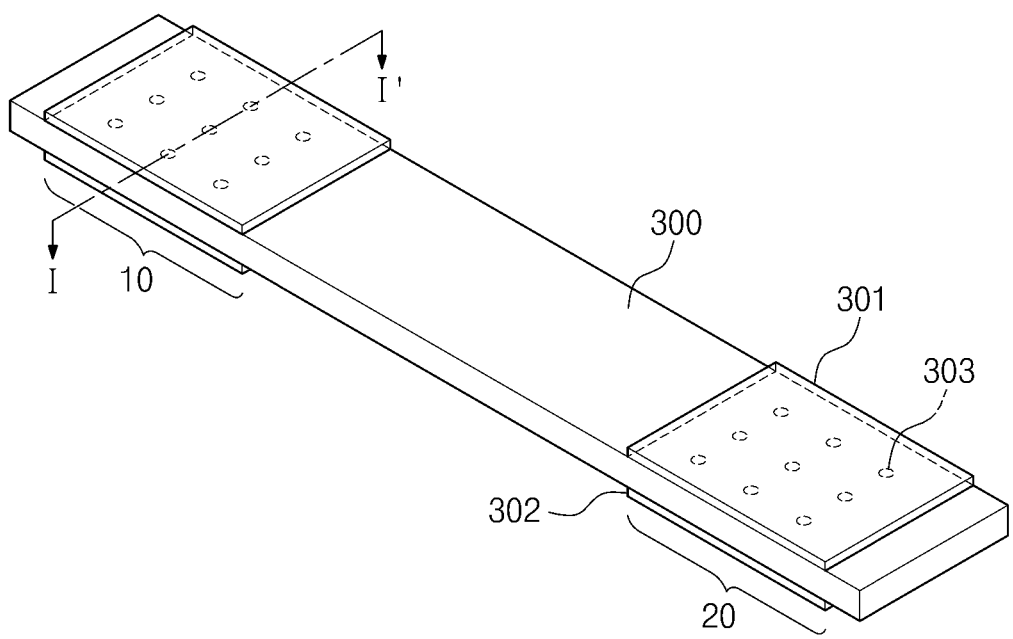
FIG. 3A is a perspective view illustrating a heat dissipation device according to another embodiment of the present invention.
Figure 3B:
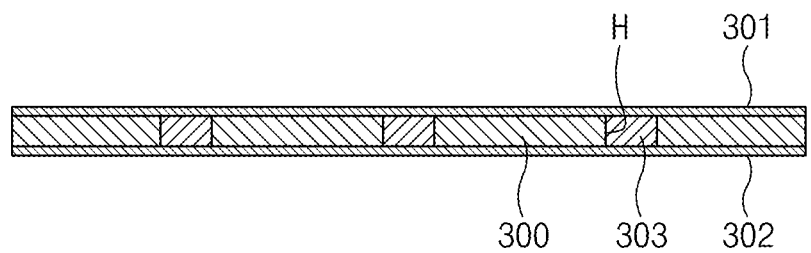
FIG. 3B is a cross-sectional view taken along line I-I' of FIG. 3A.
Figure 3C:
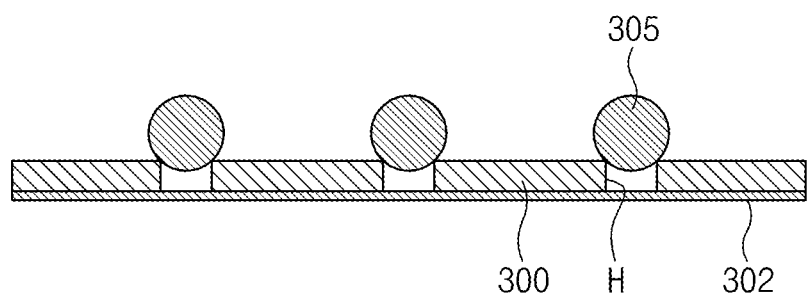
FIG. 3C is a cross-sectional view taken along line I-I' of FIG. 3A in the middle of a manufacturing process for the heat dissipation device.

FIG. 3A is a perspective view illustrating a heat dissipation device according to another embodiment of the present invention. FIG. 3B is a cross-sectional view taken along line I-I' of FIG. 3A. FIG. 3C is a cross-sectional view taken along line I-I' of FIG. 3A in a manufacturing process for the heat dissipation device. The configuration and function of the heat dissipation device according to the current embodiment are substantially the same as the heat dissipation device according to the embodiment of FIG. 1A. Thus, the differences between the current embodiment and the embodiment of FIG. 1A will now be described in detail.

Referring to FIGS. 3A and 3B, a graphite thin plate 300 of the heat dissipation device according to the current embodiment includes the hole shaped through regions H passing through the graphite thin plate 300 in the heat absorption region 10 and the heat dissipation region 20. Thus, metal fillers 303 passing through and contacting the graphite thin plate 300 may be cylindrical columns. The cylindrical metal fillers 303 may be connected to metal thin plates 301 and 302 disposed on the upper and lower sides of the graphite thin plate 300. Since the cylindrical metal fillers 303 have cylindrical shapes, the number of the metal fillers 303 is easily increased. Accordingly, the contact area between the cylindrical metal fillers 303 and the graphite thin plate 300 is increased, thus facilitating the heat transfer of the heat dissipation device. That is, the number of the cylindrical metal fillers 303 is greater than the number of tetragonal metal fillers, the contact area between the metal fillers 303 and the graphite thin plate 300 is increased. Thus, the vertical thermal conductivity is increased in the heat absorption region 10 and the heat dissipation region 20. The number of the metal fillers 303 disposed in the heat absorption region 10 and the heat dissipation region 20 may be varied according to the heat transfer performance of the heat dissipation device.

The cylindrical metal fillers 303 may be formed by fabricating patterns corresponding to the sizes of the through regions H of the graphite thin plate 300, and then, by inserting the metal fillers 303 into the through regions H.

Referring to FIG. 3C, metal spheres 305 are respectively disposed on the through regions H of the graphite thin plate 300, and then, the metal spheres 305 may be pressed and heated to fill the through regions H, thus forming the metal fillers 303. The diameters of the metal spheres 305 may be greater than those of the through regions H. After the through regions H are filled with the metal spheres 305, the metal spheres 305 may be attached at a high temperature to the metal thin plates 302 adhered to one side of the graphite thin plate 300.

Figure 4A:
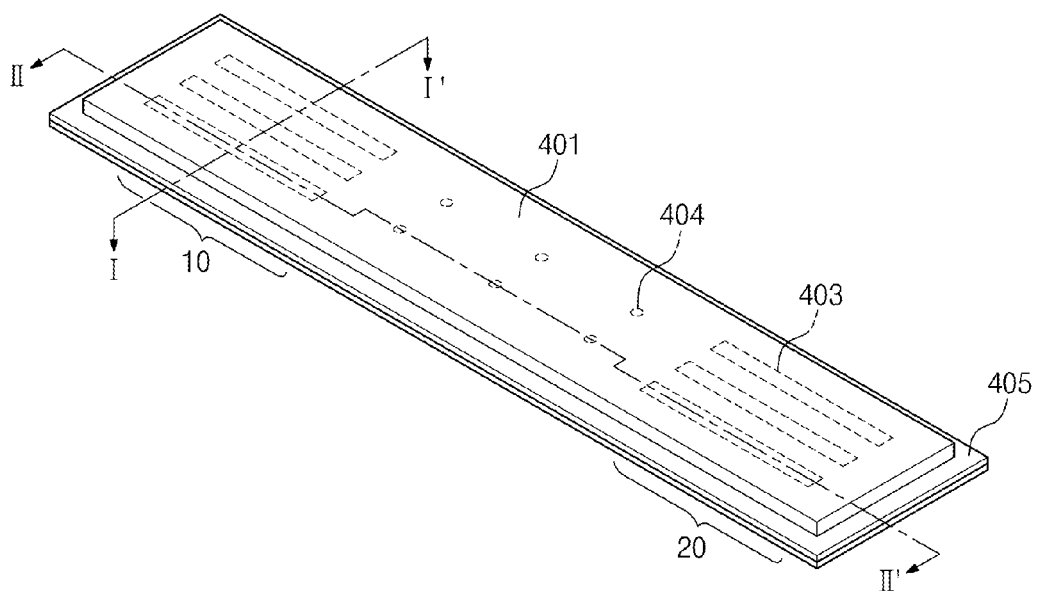
FIG. 4A is a perspective view illustrating a heat dissipation device according to another embodiment of the present invention.
Figure 4B:
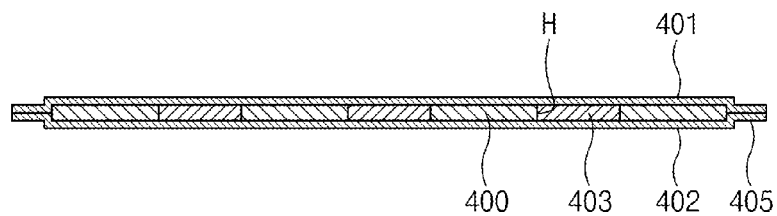
FIG. 4B is a cross-sectional view taken along line I-I' of FIG. 4A.
Figure 4C:
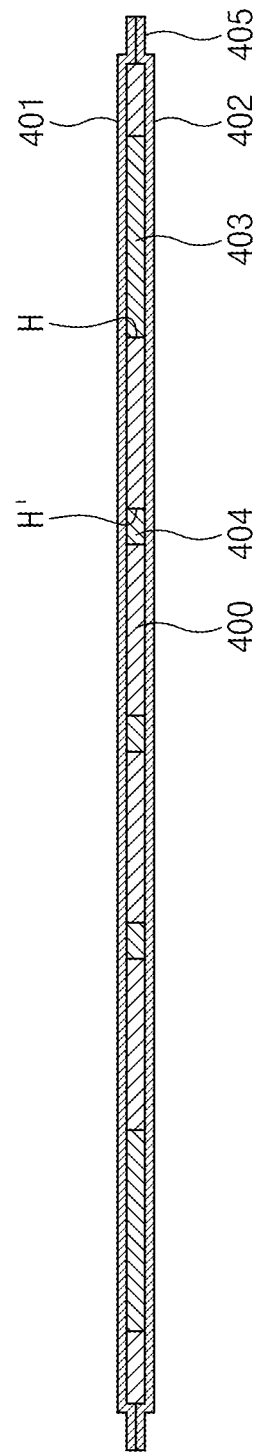
FIG. 4C is a cross-sectional view taken along line II-II' of FIG. 4A.

FIG. 4A is a perspective view illustrating a heat dissipation device according to another embodiment of the present invention. FIG. 4B is a cross-sectional view taken along line I-I' of FIG. 4A. FIG. 4C is a cross-sectional view taken along line II-II' of FIG. 4A. The configuration and function of the heat dissipation device according to the current embodiment are substantially the same as the heat dissipation device according to the embodiment of FIG. 1A. Thus, the differences between the current embodiment and the embodiment of FIG. 1A will now be described in detail.

Referring to FIGS. 4A through 4C, metal thin plates 401 and 402 of the heat dissipation device according to the current embodiment may have the same surface areas as those of a graphite thin plate 400. The metal thin plates 401 and 402 in the upper and lower portions of the heat dissipation device may be attached to each other at the edges of the graphite thin plate 400 through pressing and welding processes, so as to form an attachment portion 405 at the edges of the graphite thin plate 400. That is, the metal thin plates 401 and 402 may be attached to the upper and lower entire surfaces of the graphite thin plate 400 and seal the graphite thin plate 400. The metal thin plates 401 and 402 covering the upper and lower entire surfaces of the graphite thin plate 400 may horizontally transfer heat, together with the graphite thin plate 400, and protect the graphite thin plate 400.

Metal fillers 403 may be rectangular like the embodiments of FIGS. 1A and 2A, and disposed in each of the heat absorption region 10 and the heat dissipation region 20. That is, the metal fillers 403 may be inserted into the through regions H of the graphite thin plate 400 and in contact with the graphite thin plate 400.

Dummy metal fillers 404, for coupling the metal thin plate 401 to the metal thin plate 402, may be disposed in a space without heat transfer between the heat absorption region 10 and the heat dissipation region 20. A plurality of dummy through regions H' may be disposed between the heat absorption region 10 and the heat dissipation region 20 to install the dummy metal fillers 404. The dummy metal fillers 404 may be prefabricated metal patterns like the metal fillers 403, and inserted into the dummy through regions H', respectively. Since the dummy metal fillers 404 are used to couple the metal thin plate 401 to the metal thin plate 402, the distance of the dummy metal fillers 404 may be greater than that of the metal fillers 403 transferring heat. The dummy metal fillers 404 may be smaller than the metal fillers 403. For example, the dummy metal fillers 404 may be cylindrical.

Figure 5A:
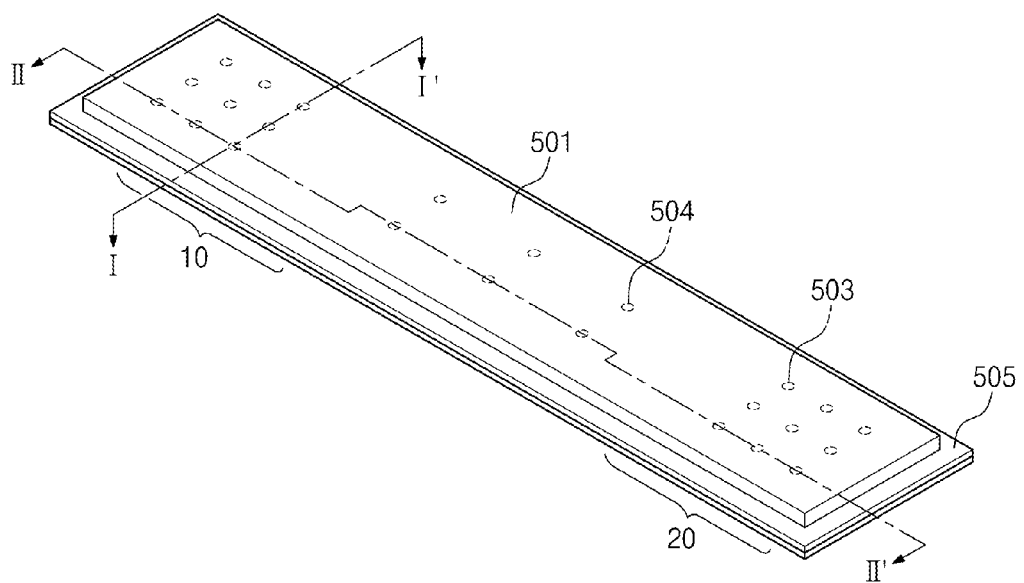
FIG. 5A is a perspective view illustrating a heat dissipation device according to another embodiment of the present invention.
Figure 5B:
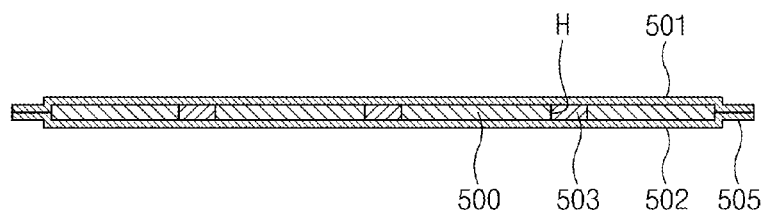
FIG. 5B is a cross-sectional view taken along line I-I' of FIG. 5A.
Figure 5C:
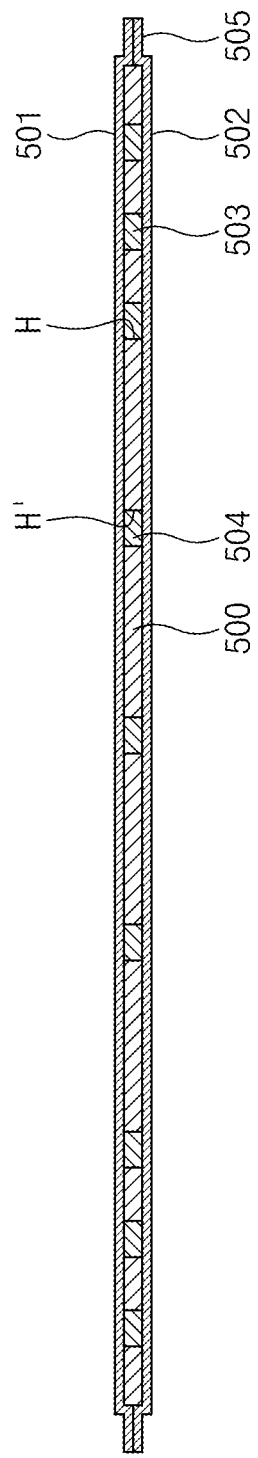
FIG. 5C is a cross-sectional view taken along line II-II' of FIG. 5A.

FIG. 5A is a perspective view illustrating a heat dissipation device according to another embodiment of the present invention. FIG. 5B is a cross-sectional view taken along line I-I' of FIG. 5A. FIG. 5C is a cross-sectional view taken along line II-II' of FIG. 5A. The configuration and function of the heat dissipation device according to the current embodiment are substantially the same as the heat dissipation device according to the embodiment of FIG. 4A. Thus, the differences between the current embodiment and the embodiment of FIG. 4A will now be described in detail.

Referring to FIGS. 5A through 5C, the heat dissipation device according to the current embodiment includes metal fillers 503 and dummy metal fillers 504 that may have the same shapes. That is, the metal fillers 503 and the dummy metal fillers 504 may be cylindrical and inserted into a graphite thin plate 500.

The distance between the metal fillers 503 installed in the heat absorption region 10 and the heat dissipation region 20 of the graphite thin plate 500 may be smaller than the distance between the dummy metal fillers 504 to improve the heat transfer performance of the heat dissipation device. The metal fillers 503 are more than the dummy metal fillers 504. Accordingly, the contact area between the metal fillers 503 and the graphite thin plate 500 may be greater than the contact area between the dummy metal fillers 504 and the graphite thin plate 500. Thus, the vertical heat transfer may be improved in the heat absorption region 10 and the heat dissipation region 20.

The metal fillers 503 and the dummy metal fillers 504 are connected to an upper metal thin plate 501 and a lower metal thin plate 502. The upper and lower metal thin plates 501 and 502 are attached to each other to form an attachment portion 505 at the edges of the graphite thin plate 500.

According to the embodiments of the present invention, the graphite thin plate is used to fabricate a thin and lightweight heat dissipation device, and the thermal conductivity along the horizontal direction (i.e. along the planar surface) can be improved.

In addition, the vertical thermal conductivity can be improved through the metal fillers passing through the graphite thin plate.

In addition, the upper and lower metal thin plates of the graphite thin plate improve the thermal conductivity of the heat dissipation device, and function as protective layers.

That is, the heat dissipation device according to the embodiment of the present invention may be used as a heat dissipation device of ultra thin electronic appliances and various high performance small portable electronic appliances.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A solid type heat dissipation device comprising:
a graphite thin plate formed of graphite and including a plurality of through regions, the graphite thin plate including a heat absorption region and a heat dissipation region that are spaced apart from each other;
a plurality of metal fillers respectively disposed in the through regions and contacting the graphite thin plate; and
a plurality of metal thin plates attached to upper and lower surfaces of the graphite thin plate and connected to the metal fillers, the metal thin plates including first metal thin plates that cover surfaces of the graphite thin plate in the heat absorption region and second metal thin plates that cover surfaces of the graphite thin plate in the heat dissipation region,
wherein the first metal thin plates are spaced apart from the second metal thin plates, and the graphite thin plate between the heat absorption region and the heat dissipation region is exposed to an exterior without being covered by the metal thin plates.

2. The solid type heat dissipation device of claim 1, wherein the through regions are elongated along a long axis direction of the graphite thin plate.

3. The solid type heat dissipation device of claim 1, wherein the through regions are through holes passing through the graphite thin plate.

4. The solid type heat dissipation device of claim 1, wherein the metal fillers and the metal thin plates are formed of an identical metal.

5. The solid type heat dissipation device of claim 1, wherein the through regions are disposed in the heat absorption region and the heat dissipation region.

6. The solid type heat dissipation device of claim 5, wherein the metal thin plates are attached to each other in the through regions through a coining process, and
the metal fillers are formed from portions of the metal thin plates.

7. The solid type heat dissipation device of claim 5, wherein the graphite thin plate further comprises a plurality of dummy through regions that pass through the graphite thin plate between the heat absorption region and the heat dissipation region, and
the solid type heat dissipation device further comprises a plurality of dummy metal fillers that are respectively disposed in the dummy through regions and are connected to the metal thin plates.

8. The solid type heat dissipation device of claim 7, wherein a contact area between the dummy metal fillers and the graphite thin plate is less than a contact area between the metal fillers and the graphite thin plate.

9. The solid type heat dissipation device of claim 7, wherein a distance between the dummy metal fillers is greater than a distance between the metal fillers.

10. The solid type heat dissipation device of claim 1, wherein the metal thin plates are attached to each other at side surfaces of edges of the graphite thin plate, so as to seal the graphite thin plate.

11. The solid type heat dissipation device of claim 1, wherein:
the first metal thin plates cover the entire upper surface of the graphite thin plate in the heat absorption region and the entire lower surface of the graphite thin plate in the heat absorption region;
the second metal thin plates cover the entire upper surface of the graphite thin plate in the heat dissipation region and the entire lower surface of the graphite thin plate in the heat dissipation region; and
the first metal thin plates are spaced apart from the second metal thin plates along the long axis direction of the graphite thin plate.

12. A solid type heat dissipation device comprising;
a graphite thin plate formed of graphite and including a heat absorption region and a heat dissipation region that are spaced apart from each other;
first metal fillers penetrating the heat absorption region;
second metal fillers penetrating the heat dissipation region; and
a metal thin plate attached to upper and lower surfaces of the graphite thin plate and connected to the first and second metal fillers,
wherein the metal thin plate is flat and extends from the heat absorption region to the heat dissipation region to directly contact the surfaces of the graphite thin plate located between the heat absorption region and the heat dissipation region.

* * * * *